United States Patent [19]

Aston

[11] 4,121,174

[45] Oct. 17, 1978

[54] ADJUSTABLE MICROWAVE POWER COMBINER FOR PLURALITY OF COAXIAL CIRCUITS

[75] Inventor: Richard Aston, Claremont, Calif.

[73] Assignee: General Dynamics Corporation, Pomona, Calif.

[21] Appl. No.: 846,965

[22] Filed: Oct. 31, 1977

[51] Int. Cl.² ............................................. H03B 7/14
[52] U.S. Cl. .................................... 331/48; 330/287; 331/56; 331/96; 331/101; 331/107 R
[58] Field of Search ...................... 331/48, 55, 56, 96, 331/101, 107 R, 107 G, 107 T; 330/287

[56] References Cited

U.S. PATENT DOCUMENTS

| | | | |
|---|---|---|---|
| 3,628,171 | 12/1971 | Kurokawa et al. | 331/56 |
| 3,931,587 | 1/1976 | Harp et al. | 331/56 |
| 3,943,463 | 3/1976 | Kuno et al. | 331/96 X |
| 4,034,314 | 7/1977 | Dydyk | 331/101 |
| 4,075,578 | 2/1978 | Dydyk | 331/56 |

*Primary Examiner*—Siegfried H. Grimm
*Attorney, Agent, or Firm*—Freling E. Baker; Neil F. Martin; Edward B. Johnson

[57] ABSTRACT

A power combining device for combining the microwave power from a plurality of solid state devices comprises a housing defining a resonator cavity with a plurality of co-axial microwave circuits, including a microwave diode at one end of each circuit and a tapered adjustable attenuator at the other end thereof, which are positioned annularly about the resonator cavity so that the energy generated therein is combined within the cavity and transmitted by way of a common outlet. The power combiner is provided with a broad range of bandwidth adjustment by providing for the adjustment of many of the parameters of the system including the length of the circuits, the damping of the circuits, and length of the resonator cavity, and the degree of coupling to adjacent circuits.

16 Claims, 4 Drawing Figures

ADJUSTABLE MICROWAVE POWER COMBINER FOR PLURALITY OF COAXIAL CIRCUITS

BACKGROUND OF THE INVENTION

The present invention relates to microwave power sources and pertains particularly to the combining of multiple solid state power generating circuits to increase the power output of a solid state generator.

Solid state power generators have come into wide use in recent years. However, one problem with such generators is the limited power output available therefrom. Several proposals for combining the power output of multiple microwave generating circuits are known in the art.

One approach to the combining of power outputs is disclosed, for example, in U.S. Pat. No. 3,962,654, issued June 8, 1976 to Corrons et al., entitled "A Multiple Diode Microwave Oscillator Apparatus" and assigned to the assignee hereof. In this patent a plurality of IMPATT diodes are mounted radially of a central cavity within a housing where the power output from the diodes are combined and transmitted by a common output conductor.

A number of other techniques for combining the outputs from solid state power sources are known in the arts. For example, the broad concept of mounting a plurality of diodes in a co-axial circular array about a substantially cylindrical resonator cavity are taught in an article entitled "A Multiple Diode High Average Power Avalanch Diode Oscillator", published in the IEEE Transactions On Microwave Theory and Techniques, December 1969; and an article entitled "Impact Diode Oscillators With Electrical Frequency Tuning and Multi Diode Oscillators", by A. S. Tager and A. D. Khodnevich, published in Radio Engineering and Electronic Physics, Volume 14, No. 3, 1969.

Other approaches are disclosed and discussed, for example, in U.S. Pat. No. 3,931,587, issued Jan. 6, 1976 to Harp et al., and entitled "Microwave Power Accumulator".

One of the major drawbacks of these various approaches to this combining of microwave power from solid state devices is that the matching of the various components of the system is very critical. Thus, very critical tolerances must be maintained in the manufacturing of such devices in order to obtain the desired output.

Furthermore, while such devices do provide for a certain amount of adjustment in frequency, this adjustment is over a very narrow band of frequency range.

Accordingly, it is desirable that a microwave power combiner be available that can be adjusted over a broader band width than the prior art devices without the need for machining of new parts and in which manufacturing tolerances can be relaxed, resulting in an apparatus that can be produced by mass production techniques.

SUMMARY AND OBJECTS OF THE INVENTION

Accordingly, it is the primary object of the present invention to overcome the above problems of the prior art.

Another object of the present invention is to provide an improved power combiner device.

A further object of the present invention is to provide a power combining apparatus which is tunable over a broad frequency range.

A still further object of the present invention is to provide a power combiner that is free of spurious oscillations and is capable of production by mass production technique.

In accordance with the primary aspect of the present invention, a power combiner for combining the output of multiple IMPATT diodes comprises a housing having a centrally disposed resonant cavity, around which is disposed in a co-axial relationship a plurality of oscillator circuits wherein the output is combined in the resonator cavity and includes a common output. The many parameters of the device including the length of the respective circuits, the length of individual circuits coupling between the resonant cavity and the output circuit and the tuning of the resonant cavity are all adjustable.

BRIEF DESCRIPTION OF THE DRAWING

The above and other objects and advantages of the present invention will become apparent from the following description when taken in conjunction with the drawing, wherein.

DETAILED DESCRIPTION OF A PREFERRED EMBODIMENT

Figure 1:
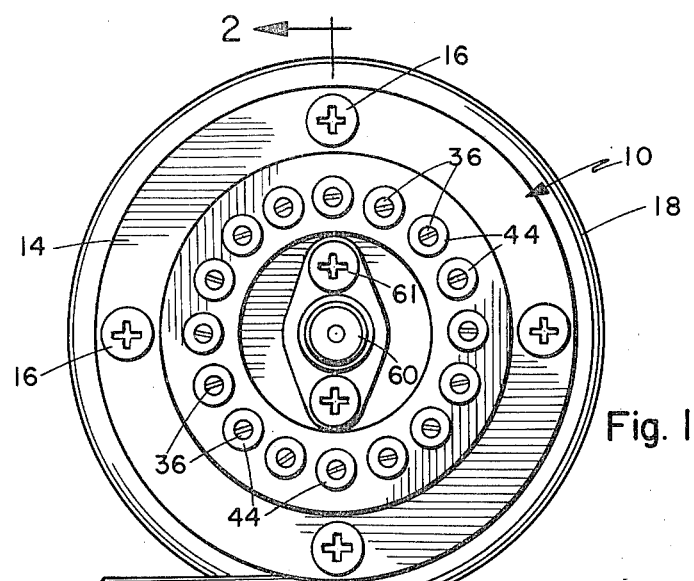
FIG. 1 is a top plan view of a power combiner in accordance with the invention.
Figure 2:
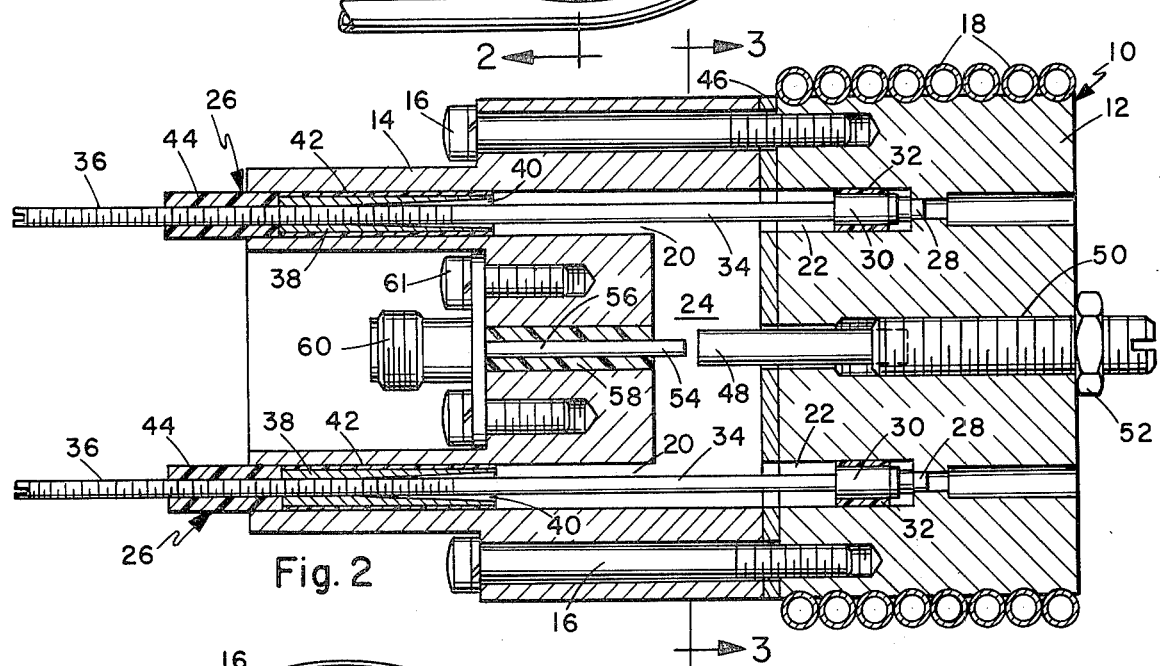
FIG. 2 is a sectional view taken along lines 2—2 of FIG. 1.

Turning now to the drawings, particularly FIGS. 1 and 2, there is illustrated a power combiner in accordance with the present invention, designated generally by the numeral 10. The power combiner comprises a housing defined by a first housing member 12 formed preferably of a good heat conducting material, such as a copper block, and a second housing member 14 formed of a suitable material, such as aluminum. The housings are both of a generally cylindrical configuration and detachably connected together by suitable means, such as a plurality of bolts 16. The lower housing 12 defines a heat sink and includes a plurality of cooling coils 18 such as copper coils, secured in a suitable fashion, such as by a brazing or soldering to the outer surface of the housing portion 12. A suitable coolant is circulated through the coils for cooling the heat sink portion 12 of the housing. The housing includes a plurality of axial bores 20 extending from the upper housing 14 co-axially with corresponding bores 22 in the lower housing 12. The upper housing 14 has a substantially cylindrical cavity 24 which defines a resonator chamber or cavity, whose function will be further explained later.

The power combiner includes a plurality of co-axial oscillator circuits designated generally by the numeral 26, mounted within the housing in the co-axial bores 20 and 22.

Each of the circuits 26 comprises a negative resistance semiconductor diode, such as an IMPATT diode 28 mounted, such as by soldering, into the reduced diameter portion of the bore 22 in the housing 12. The housing 12 functions as a heat sink for a plurality of the diodes 28. An impedance transformer 30 is suitably coupled directly to the diode 28 and is surrounded by an appropriate dielectric 32, such as that sold under the trademark Rexolite, within the bore 22. A co-axial conductor 34 is then connected directly to the transformer 30 and extends co-axially of the bores 22 and 20 externally of the upper housing 14. The conductor 34 includes an upper threaded portion 36 on which is mounted a damping member 38 in the form of a sleeve having a tapered or conical shaped bore 40 opening toward the cavity 24. The damping member 38 is adjustably mounted on the conductor 34 for damping or absorbing any microwaves which tend to pass into the external bias circuit. The element 38 is constructed of a suitable material, such as polyiron, such as that sold under the name Echo-Sorb, specification number MF 500-F-117, manufactured by Emerson and Cuming.

Figure 3:
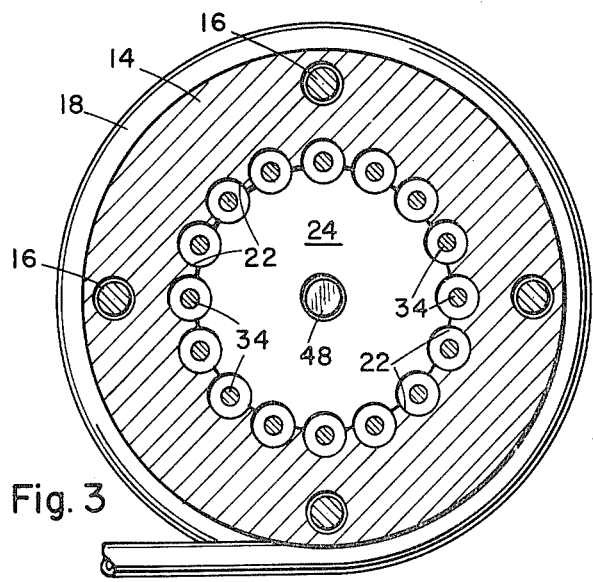
FIG. 3 is a sectional view taken on line 3—3 of FIG. 2.

A plurality of such co-axial circuits 26 are arranged around the periphery of the resonator cavity 24. As best seen in FIG. 3, the bores 20 from the upper housing open into the cavity on one side thereof forming a coupling iris opening into the cavity.

The damping member 38 is insulated from the housing 14 by an insulating material 42, such as Teflon and is attached to a holder 44 of a suitable material, such as Polystyrene. The element 38 can thus be adjusted in position such that it suppresses spurious oscillations and minimizes reflections within the circuit. Undesirable and unwanted frequency components are dissipated by the damping means 38 such that these unwanted or spurious oscillations are suppressed and/or minimized. A spacer 46 is placed between the upper and lower housings 12 and 14 for simultaneously adjusting the length of the respective co-axial circuits. A spacer would be available in any number of desired thicknesses to quickly and conveniently change this dimension of the structure. The spacer is constructed of a suitable material, such as aluminum, and is placed in or at a relatively high impedance point in the circuit, thereby minimizing the effect of small discontinuities and air gaps within the system.

A tuning plunger 48 perturbs a strong electric field and extends into the resonator cavity 24 for tuning the cavity. This turning plunger is adjustably mounted within the lower housing 12 by a screw threaded portion 50 threaded within a bore in the housing and including suitable means, such as a lock nut 52, for locking the plunger in position. An electric field probe 54 is mounted within a bore in the upper housing 14 on the central axis of the resonator chamber 24. This probe is of an adjustable length and is connected to the external circuit through the co-axial circuit consisting of a tapped center conductor 56 mounted within a suitable dielectric, such as a Teflon sleeve 58 and including a co-axial jack 60, which is connected by bolts 61 to the housing member 14. The microwaves within the chamber 24 are then coupled through this electric field probe to the external circuit.

Figure 4:
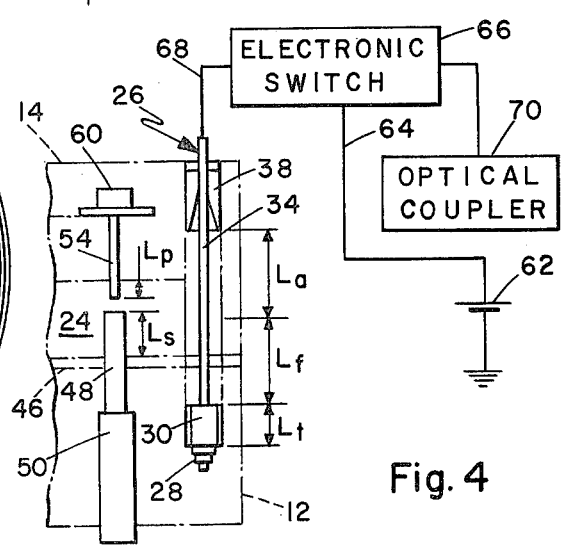
FIG. 4 is a schematic diagram of a circuit in accordance with the present invention.

With the construction as described above, specific pre-selected dimensions are not essential as in the prior art constructions. Turning now to FIG. 4, it will be seen that the dimensions marked $L_t$, $L_f$, $L_a$, $L_s$ and $L_p$ are adjustable in the present construction. There is no unique set of dimensions which is required to cause the circuit to operate with optimum efficiency. Changes in one dimension can be compensated for by counter balancing change in another dimension. The means for adjusting these dimensions in the present invention are provided as follows:

$L_s$ may be changed by turning the tuning screw 50 and lock nut 52. This adjusts the extension of the probe 48 into the chamber 24. This likewise adjusts the spacing between the tuning probe and the electrical probe 54. The dimension $L_a$ is changed by adjusting the position of the tapered bore 40 of the damping member 38 along conductor 34. This is done simply by adjusting the member 44 along the screw threads 36 on the conductor 34. $L_t$ is adjusted or changed by simply replacing the transformer 30 with one of a desirable length.

$L_f$ is changed simultaneously on the plurality of co-axial circuits by replacing the spacer 46 with one of the desired thickness. The length $L_p$ is changed by adjusting the position of the probe 54 or by replacing the probe with another probe of a selected length.

The effect of providing for these adjustments in the dimensions of the construction is that the power combiner can be adjusted over a broader bandwidth without the need for machining of new parts, as in the prior art. This construction also permits the relaxing of machining tolerances, such that more manufacturable items are provided which may be produced on mass production basis.

The remainder of the circuit includes a DC source 62 connected through a conductor 64 to an electronic switch 66 and from there by means of a conductor 68 to the end of the probe or conductor 34. The electronic switch 66 is controlled by suitable means such as an optical coupler 70 which reduces electrical stress on switch 66, permitting use of mass-produced components. That is, components do not have to be selectively chosen and tested for tolerances and to meet stringent specs before use in the instant device. A bias current from this DC source is imparted to the IMPATT diode 28. The electronic switch 66 is preferably fabricated on a 0.5 inch by 0.35 inch alumina substrate and is driven by conventional optical coupler 70 which isolates the switch by preventing ground current from the high IMPATT voltages. The circuit is arranged to apply pulses of bias current to each of the diodes.

While the present invention has been illustrated by means of a specific embodiment, numerous changes may be made therein within the scope of the invention as defined by the appended claims.

Having described our invention, we now claim:

1. A microwave power combiner comprising in combination:
   a plurality of co-axial circuits, each having a longitudinal axis and a solid state microwave diode at one end of the axis and a tapered adjustable attenuator at the other end thereof, an impedance transformer connected to said diode and an elongated conductor element extending from said transformer through said attenuator,
   housing means defining an adjustable resonator cavity, said plurality of circuits mounted in said housing means surrounding said cavity,
   an output port centrally disposed in said cavity with respect to said circuits for receiving the combined outputs from said circuits.

2. The power combiner of claim 1, wherein said resonator cavity is substantially cylindrical in configuration, and
   said co-axial circuits are disposed around the circumference of said cavity.

3. The power combiner of claim 1, wherein said attenuator is adjustable along the longitudinal axis of said circuit.

4. The power combiner of claim 3, wherein said circuits are mounted within cylindrical bores in said housing and said bores communicate intermediate the length thereof with said resonator cavity.

5. The power combiner of claim 3, including means for adjusting the relative position of the communication of said cylindrical bore with said cavity.

6. The power combiner of claim 5, wherein said housing means comprises first and second housing members, said resonator cavity is formed in one of said housing members, and
said means for adjusting said relative position comprises a plurality of spacer members for selectively placing between said housing members.

7. The power combiner of claim 4, wherein said attenuator comprises a sleeve mounted in said bore and having a conical shaped opening at one end oriented toward said resonator cavity.

8. The power combiner of claim 7 wherein said attenuator is secured at the other end to an insulating sleeve which sleeve is threadably mounted on said elongated conductor element.

9. The power combiner of claim 2, wherein said housing means comprises a first housing member defining a heat sink and a second housing member detachably connected to said first housing member and defining said resonator cavity.

10. The power combiner of claim 9, wherein said circuits are mounted in a plurality of bores extending parallel to the axis of said resonator cavity, said bores extending through said second housing member and at least into said first housing member, and said microwave diodes are mounted within said bores in said first housing member.

11. The power combiner of claim 10, wherein said diode is a negative resistance IMPATT diode.

12. The power combiner of claim 11, wherein said first housing member is constructed of copper and said second housing member is constructed of aluminum.

13. The power combiner of claim 2, comprising a tuning plunger extending into said resonator cavity co-axially thereof and adjustably mounted in said housing.

14. The power combiner of claim 13, including a field probe extending into said chamber co-axially of said tuning plunger for transmitting the combined microwaves to an external circuit.

15. The power combiner of claim 9, and including cooling coils mounted in heat conductive relationship to said first housing member and a coolant circulating through said coils.

16. The power combiner of claim 1, including an electronic switch operably connected to said elongated conductor element and to a source of voltage, said electronic switch controlled by an optical coupler operably connected to said switch, whereby bias current is applied to each of said diodes.

* * * * *